(12) United States Patent
Sunaoshi

(10) Patent No.: US 8,653,487 B2
(45) Date of Patent: Feb. 18, 2014

(54) LITHOGRAPHY APPARATUS AND LITHOGRAPHY METHOD

(75) Inventor: Hitoshi Sunaoshi, Kanagawa (JP)

(73) Assignee: NuFlare Technology, Inc., Numazu-shi (JP)

(*) Notice: Subject to any disclaimer, the term of this patent is extended or adjusted under 35 U.S.C. 154(b) by 245 days.

(21) Appl. No.: 12/343,997

(22) Filed: Dec. 24, 2008

(65) Prior Publication Data

US 2009/0168044 A1 Jul. 2, 2009

(30) Foreign Application Priority Data

Dec. 27, 2007 (JP) ................................. 2007-336619

(51) Int. Cl.
  *G21K 5/00* (2006.01)

(52) U.S. Cl.
  USPC ............... 250/492.22; 250/492.2; 250/492.23

(58) Field of Classification Search
  USPC .......................................... 250/492.22, 492.2
  See application file for complete search history.

(56) References Cited

U.S. PATENT DOCUMENTS

| | | | | |
|---|---|---|---|---|
| 5,533,170 A * | 7/1996 | Teitzel et al. | ................... | 358/1.8 |
| 6,647,309 B1 * | 11/2003 | Bone | .............................. | 700/121 |
| 6,862,725 B2 * | 3/2005 | Takagi et al. | .................... | 716/54 |
| 6,999,164 B2 * | 2/2006 | Hasan | ......................... | 356/237.4 |
| 7,174,520 B2 * | 2/2007 | White et al. | ................... | 716/136 |
| 7,337,426 B2 * | 2/2008 | Kotani et al. | .................... | 716/52 |
| 7,554,107 B2 * | 6/2009 | Yoshitake et al. | ........ | 250/492.22 |
| 7,665,661 B2 * | 2/2010 | Wang | ............................. | 235/385 |
| 7,978,906 B2 * | 7/2011 | Jojic et al. | ..................... | 382/159 |
| 2003/0044730 A1 | 3/2003 | Fujimoto et al. | | |
| 2005/0196680 A1 | 9/2005 | Bouche et al. | | |

FOREIGN PATENT DOCUMENTS

| | | |
|---|---|---|
| JP | 1-69238 U | 5/1989 |
| JP | 2001-92110 | 4/2001 |
| JP | 2002-116533 A | 4/2002 |
| JP | 2003-75983 A | 3/2003 |
| JP | 2003-121982 A | 4/2003 |
| JP | 2005-538425 A | 12/2005 |
| JP | 2006-84849 A | 3/2006 |
| JP | 2007-233164 | 9/2007 |

OTHER PUBLICATIONS

U.S. Appl. No. 12/417,933, filed Apr. 3, 2009, Sunaoshi.
Japanese Office Action issued Jun. 12, 2012 in patent application No. 2007-336619 with English translation.

* cited by examiner

*Primary Examiner* — Phillip A Johnston
(74) *Attorney, Agent, or Firm* — Oblon, Spivak, McClelland, Maier & Neustadt, L.L.P.

(57) ABSTRACT

A lithography apparatus includes a generating unit configured, by receiving character information which specifies a shape of an identification figure representing identification information of a target object, to generate pattern writing data of the identification figure on the basis of the character information; a synthesizing unit configured, by receiving a pattern writing data of a pattern written on the target object, to synthesize the pattern writing data of the pattern and the pattern writing data of the identification figure; and a pattern writing unit configured to write the pattern and the identification figure on the target object on the basis of the synthesized pattern writing data.

8 Claims, 6 Drawing Sheets

```
LAYOUTNAME= "AAAA"
ID0= "123456"
ID1= "INPUTDATE"
ID2= "WRITER_123-EUVPLATE-PEB_33-DZV_11"
ID3= "LAYOUTNAME"
ID4= "WRITEDATE"
ID5= "OPERATER"
MASK_SIZE=6
DOSE=10
ID_DIMENSION=QR
ID_SIZE=25
ID_X=-70000
ID_Y=-70000
CHIP1_SIZE=10000
CHIP1_X=-50000
CHIP1_Y=-50000
CD_CORRECTION=ON
        ⋮
```

FIG. 3

LITHOGRAPHY APPARATUS AND LITHOGRAPHY METHOD

CROSS-REFERENCE TO RELATED APPLICATION

This application is based upon and claims the benefit of priority from prior Japanese Patent Application No. 2007-336619 filed on Dec. 27, 2007 in Japan, the entire contents of which are incorporated herein by reference.

BACKGROUND OF THE INVENTION

1. Field of the Invention

The invention relates to a lithography apparatus and a lithography method and, for example a lithography method and apparatus which writes a pattern on a target object using an electron beam.

2. Related Art

A lithography technique which advances the development of micropatterning of a semiconductor device is a very important process, the only process to generate a pattern in semiconductor manufacturing processes. In recent years, as integration density increases in LSIs, a circuit line width requested for a semiconductor device is miniaturized year by year. In order to form a desired circuit pattern for the semiconductor device, a high-precision original pattern (also called a reticle or a mask) is necessary. In this case, an electron beam pattern writing technique primarily has an excellent resolution, and is used in manufacture of a high-precision original pattern.

FIG. 7 is a conceptual diagram for explaining an operation of a variable-shaped electron beam lithography apparatus.

The variable-shaped electron beam (EB) lithography apparatus operates as described below. In a first aperture plate 410, a square, for example, rectangular opening 411 to shape an electron beam 330 is formed. In a second aperture plate 420, a variable-shaped opening 421 to shape the electron beam 330 passing through the opening 411 into a desired square shape is formed. The electron beam 330 irradiated from a charged particle source 430 and passing through the rectangular opening 411 is deflected by a deflector. The beam passes through a part of the variable-shaped opening 421 and is irradiated on a target object which is placed on a stage and coated with a resist material. The stage continuously moves in one predetermined (for example, an X direction) during pattern writing. In this manner, a square shape which can pass through both the rectangular opening 411 and the variable-shaped opening 421 is written on a pattern writing region of the target object 340. A scheme that causes a beam to pass through both the opening 411 and the variable-shaped opening 421 to form an arbitrary shape is called a variable-shaped scheme.

An identifying (ID) figure to identify a mask itself is written outside a chip region for manufacturing an original semiconductor of a mask serving as a target object. For example, the figure is written by a bar-code pattern (for example, see JP-A-2001-92110). For example, when the mask is to be written, an ID figure to identify the mask itself described above is written together with a pattern to manufacture an original semiconductor at the same time. In a conventional art, to write the ID figure, a graphic data representing an ID figure is formed by using a CAD or the like in advance. The graphic data for the ID is formed by the same format as that of a pattern data for manufacturing an original semiconductor. However, the ID figure is unique to the mask. Different ID figures are used different masks. For this reason, the graphic data for the ID must be cumbersomely formed for each mask. Since the ID figure is formed by using a CAD or the like in advance, information obtained immediately before pattern writing, information such as a time of day of actual pattern writing, and the like cannot be described. However, for a user side, the information obtained immediately before pattern writing is strongly required to be written in a mask as an ID figure.

As described above, the information obtained immediately before is strongly required to be written as the ID figure on the mask. However, as in pattern data for manufacturing a semiconductor, graphic data representing the ID figure must be additionally formed by an external apparatus or the like in advance, and the information obtained immediately before the pattern writing is difficult to be included in the ID figure.

BRIEF SUMMARY OF THE INVENTION

The invention has as its object to provide a lithography method and apparatus which can write an ID figure without forming graphic data in advance.

According to an embodiment of the invention, there is provided a lithography apparatus, including a generating unit configured, by receiving character information which specifies a shape of an identification figure representing identification information of a target object, to generate pattern writing data of the identification figure on the basis of the character information; a synthesizing unit configured, by receiving a pattern writing data of a pattern written on the target object, to synthesize the pattern writing data of the pattern and the pattern writing data of the identification figure; and a pattern writing unit configured to write the pattern and the identification figure on the target object on the basis of the synthesized pattern writing data.

According to an embodiment of the invention, there is provided a lithography method, including by receiving character information which specifies a shape of an identification figure representing identification information of a target object, generating pattern writing data of the identification figure on the basis of the character information; by receiving a pattern writing data of a pattern written on the target object, synthesizing the pattern writing data of the pattern and the pattern writing data of the identification figure; and writing the pattern and the identification figure on the target object on the basis of the synthesized pattern writing data.

BRIEF DESCRIPTION OF THE DRAWINGS

FIG. 3 is a diagram showing an example of a JOB file in the first embodiment.

DETAILED DESCRIPTION OF THE INVENTION

In each embodiment, a configuration using an electron beam as an example of a charged particle beam will be described below. The charged particle beam is not limited to the electron beam, and a beam such as an ion beam using charged particles may be employed. As an example of a charged particle beam lithography apparatus, especially, a variable-shaped electron beam lithography apparatus will be described below. Although an electron beam lithography apparatus will be described below as an example, the invention is not limited to the electron beam lithography apparatus. The invention can be similarly applied to a laser mask lithography apparatus.

First Embodiment

Figure 1:
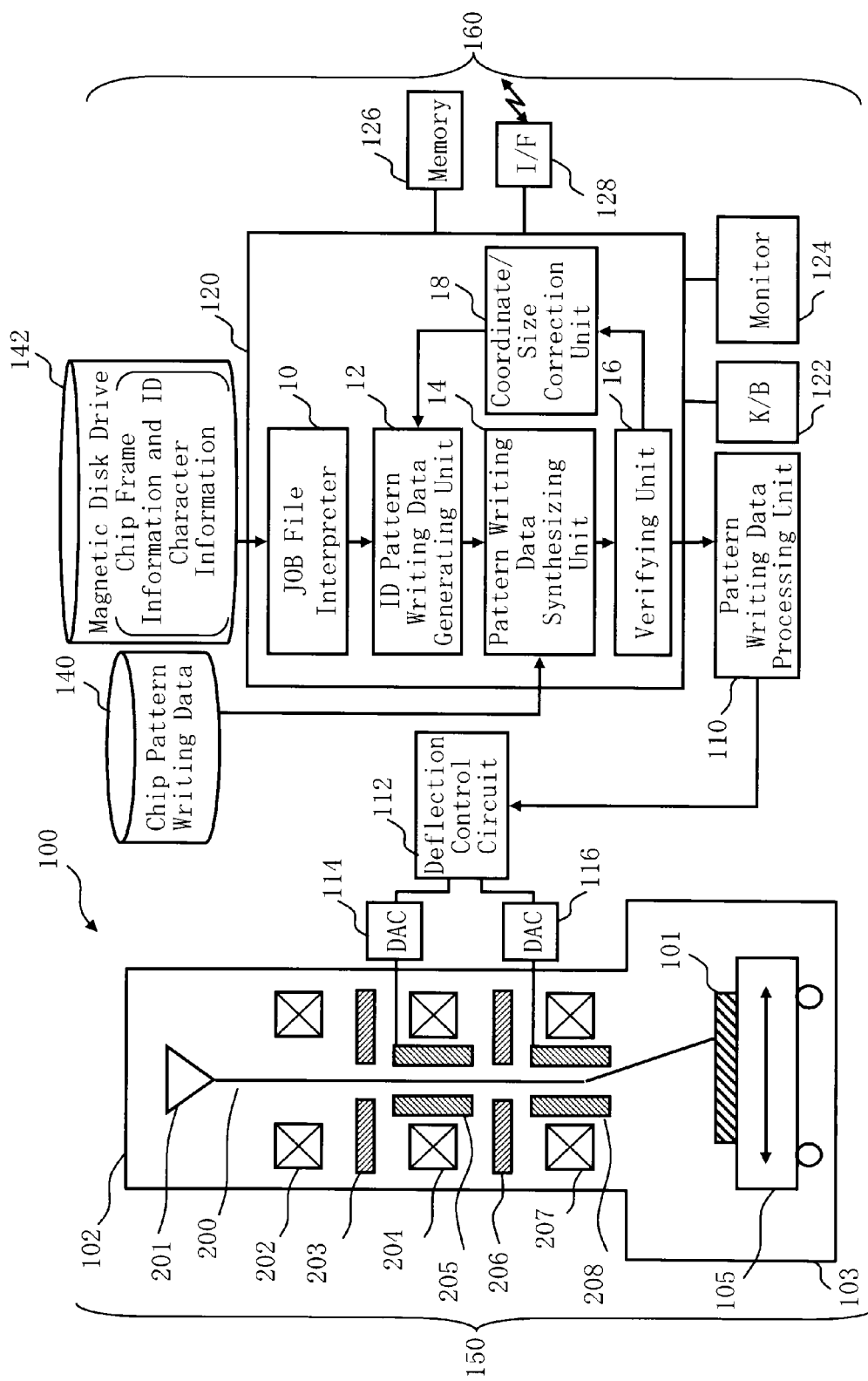
FIG. 1 is a conceptual diagram showing a configuration of a lithography apparatus according to a first embodiment.

FIG. 1 is a conceptual diagram showing a configuration of a lithography apparatus according to a first embodiment. In FIG. 1, a lithography apparatus 100 includes a pattern writing unit 150 and a control unit 160. The lithography apparatus 100 is an example of a charged particle beam lithography, or "writing" apparatus. The lithography apparatus 100 writes, or "draws" a predetermined pattern on a target object 101. The pattern writing unit 150 includes a pattern writing chamber 103 and an electron lens barrel 102 arranged in an upper part of the pattern writing chamber 103. The electron lens barrel 102 includes an electron gun assembly 201, an illumination lens 202, a first aperture plate 203, a projection lens 204, a deflector 205, a second aperture plate 206, an objective lens 207, and a deflector 208. In the pattern writing chamber 103, an X-Y stage 105 is arranged, and the target object 101 serving as a pattern writing object is arranged on the X-Y stage 105. The target object 101 includes, for example, an exposure mask to transfer a pattern to a wafer in which a semiconductor device is formed. The mask includes, for example, mask blanks in which any pattern is not formed. The control unit 160 includes a pattern writing data processing unit 110, a deflection control circuit 112, a digital-analog converters (DAC) 114 and 116, a control computer 120, a keyboard (K/B) 122, a monitor 124, a memory 126, an interface (I/F) circuit 128, and magnetic disk drives 140 and 142. The pattern writing data processing unit 110, the deflection control circuit 112, the control computer 120, the K/B 122, the monitor 124, the memory 126, the I/F circuit 128, the magnetic disk drives 140 and 142 are connected to each other by a bus (not shown). The DACs 114 and 116 are connected to the deflection control circuit 112. In the control computer 120, a job (JOB) file interpreter 10, an identification (ID) pattern writing data generating unit 12, a pattern writing data synthesizing unit 14, a verifying unit 16, and a coordinate/size correcting unit 18 are arranged. In this case, in FIG. 1, processes of functions of the JOB file interpreter 10, the ID pattern writing data generating unit 12, the pattern writing data synthesizing unit 14, the verifying unit 16, and the coordinate/size correcting unit 18 in the control computer 120 may be executed by software. The functions of the JOB file interpreter 10, the ID pattern writing data generating unit 12, the pattern writing data synthesizing unit 14, the verifying unit 16, and the coordinate/size correcting unit 18 may be configured by hardware including an electric circuit. The functions may be executed by a combination of the hardware including the electric circuit and the software. The function may be executed by a combination between the hardware and firmware.

When the functions are executed by the software or the combination including the software, information input to the control computer 120 or each information obtained during an arithmetic process and after the process is stored in the memory 126 in each case. In FIG. 1, other parts except for constituent parts necessary for explaining the first embodiment will not be repeated here. For the lithography apparatus 100, in general, another necessary configuration may be included as a matter of course.

When electron beam pattern writing is performed, a layout of a semiconductor integrated circuit is designed, and layout data (design data) in which a pattern layout is defined is generated. The layout data is converted by an external converting device to generate pattern writing data (chip pattern writing data) which can be input to the lithography apparatus 100. The chip pattern writing data to write a predetermined pattern on a target object is stored in a magnetic disk drive 140 serving as an example of the data storage unit. When a pattern writing process is to be performed, instruction contents of the process are created as a JOB file. The JOB file is stored in the magnetic disk drive 142 serving as an example of the data storage unit through the I/F circuit 128. An operator may receive file contents from the K/B 122 serving as an input unit to perform a pattern writing process to store the created file in the magnetic disk drive 142. In the JOB file, identification information to identify a target object (mask) in which a pattern is to be written is defined as character information (ID character information). The contents of the JOB file can be displayed on the monitor 124, and the operator can perform inputting, deletion, correction, or the like of the information from the K/B 122 serving as an input unit. In the JOB file, information (size and position) of a chip frame in which chip pattern writing data is written is also preferably defined.

Figure 2:
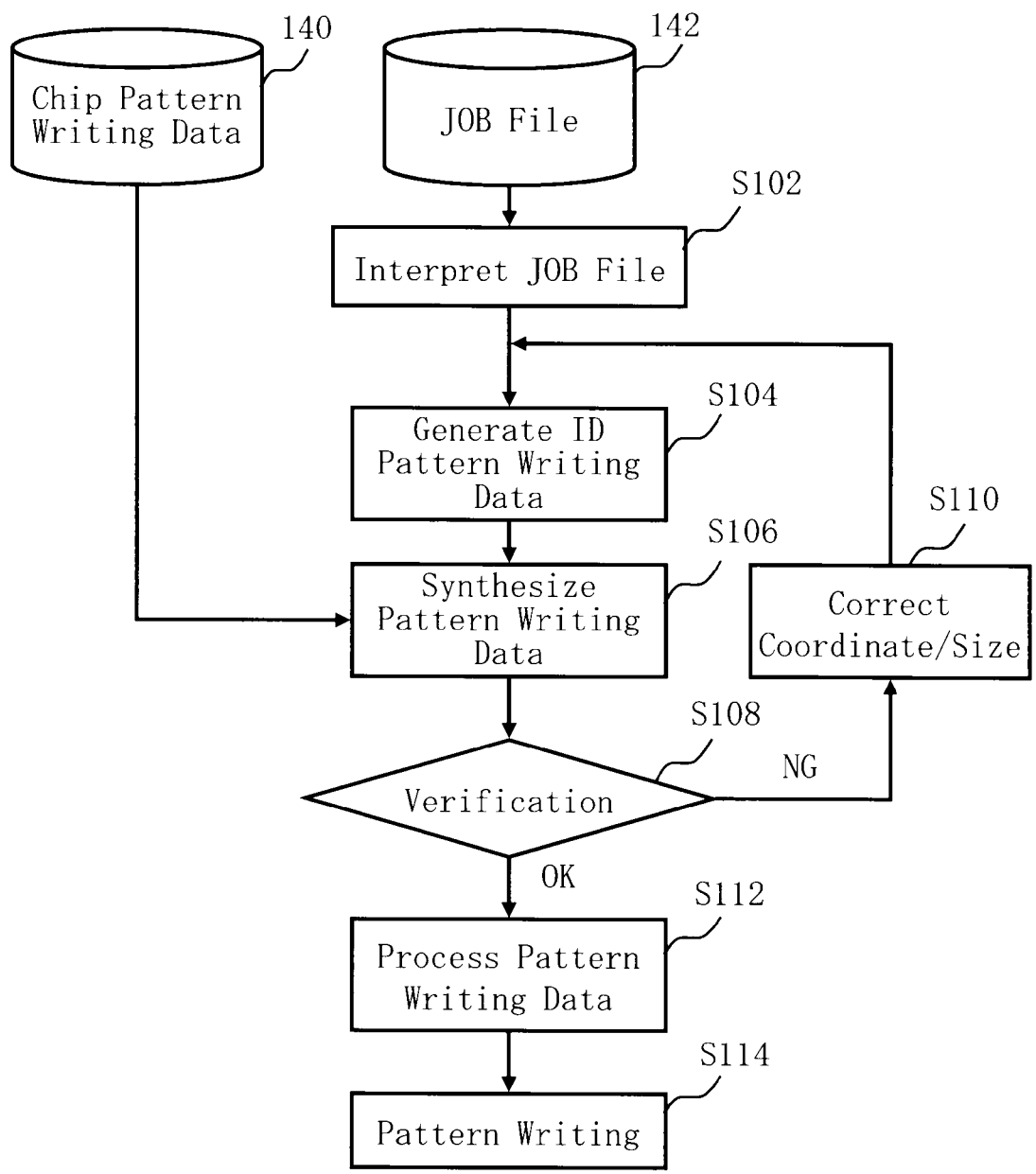
FIG. 2 is a flow chart showing main steps in a lithography method according to the first embodiment.

FIG. 2 is a flow chart showing main steps in a lithography method according to the first embodiment. In FIG. 2, the lithography method according to the first embodiment executes one series of steps including the JOB file interpreting step (S102), the ID pattern writing data generating step (S104), the pattern writing data synthesizing step (S106), the verifying step (S108), the coordinate/size correcting step (S110), the pattern writing data processing step (S112), and the pattern writing step (S114).

In S (step) 102, as the JOB file interpreting step, the JOB file interpreter 10 reads a JOB file from the magnetic disk drive 142. The JOB file interpreter 10 interprets the contents of the JOB file and confirms the presence/absence of ID character information.

FIG. 3 is a diagram showing an example of the JOB file in the first embodiment. In FIG. 3, a layout name expressed by "LAYOUTNAME" is defined in a JOB file 20. In FIG. 3, the layout name is input as, for example, "AAAA". Furthermore, as ID character information 0 displayed as "ID0", information which identifies the target object 101 itself is defined. In FIG. 3, as the information which identifies the target object 101 itself, for example, a serial number is used. For example, "123456" is displayed. This may be automatically generated by the lithography apparatus 100 or may be input by an operator through the K/B 122. Furthermore, as ID character information 1 displayed as "ID1", a time of day at which pattern writing data is input to the lithography apparatus 100 is defined. In FIG. 3, as the input time of day, for example, "INPUTDATE" is displayed. The input time of day is preferably automatically input from a timer function mounted on the control unit 160 in the lithography apparatus 100. As a matter of course, the operator may input the input time of day through the K/B 122. In addition, as ID character information 2 displayed as "ID2", a serial number of the lithography apparatus 100 to which the data is input, a type of a mask substrate, a serial number of a PEB device used as a process performed after the pattern writing, and a serial number of a developing device are defined. In FIG. 3, the serial number (identification information) of the lithography apparatus 100 is displayed as, for example, "WRITER_123". The type of the mask substrate is displayed as, for example, "EUV-PLATE". The serial number of the PEB device is displayed as, for example, "PEB_33". The serial number of the developing device is displayed as, for example, "DZV_11". Furthermore, as ID character information 3 displayed as "ID3", a layout name (name of pattern writing data) defined by the "AAAA" is automatically input. As ID character information 4 displayed by "ID4", a pattern writing time of day at which an actual pattern writing process is started is defined. In FIG. 3, the pattern writing time of day is displayed as, for example, "WRITEDATE". The pattern writing time of day is preferably automatically input from a timer function mounted on the control unit 160 in the lithography apparatus 100. As a matter of course, the operator may input the input time of day through the K/B 122. As ID character information 5 displayed by "IDS", an operator name of the lithography apparatus 100 which writes a target mask is defined. In FIG. 3, the operator name is displayed as, for example, "OPERATER". The operator may input the operator name through the K/B 122 for example. As a matter of course, when the operator name is known in advance, the operator name may be defined in advance. Furthermore, a mask size displayed as "MASK-SIZE" is defined. In FIG. 3, the mask size is input, as, for example, "6". Furthermore, a dose of a beam displayed as "DOSE" is defined, the beam being irradiated in pattern writing. As the dose, for example, "10" is input. As ID character information displayed as "ID_DIMENSION", standards of an ID figure, used when the ID character information is defined as a figure to be written into a pattern, is defined. In FIG. 3, the standard ID figure is displayed as, for example, "QR". As ID character information displayed as "ID_SIZE", a size of an ID figure is defined. In FIG. 3, the size of the ID figure is displayed as, for example, "25". As ID character information displayed as "ID_X", an X coordinate of a reference position of the ID figure is defined. In FIG. 3, the X coordinate of the reference position of the ID figure is displayed as, for example, "−70000". As ID character information displayed by "ID_Y", a Y coordinate of reference position of the ID figure is defined. In FIG. 3, the Y coordinate of a reference position of the ID figure is displayed as, for example, "−70000". As chip frame information displayed as "CHIP1_SIZE", a size (chip frame size) of an originally written chip pattern is defined. In FIG. 3, the chip frame size is displayed as, for example, "10000". As chip frame information displayed as "CHIP1_X", an X coordinate of a reference position (reference position of the chip frame) of the originally written pattern is defined. In FIG. 3, the X coordinate of the reference position of the chip pattern is displayed as, for example, "−50000". As chip frame information displayed as "CHIP1_Y", a Y coordinate of a reference position of a written chip pattern. In FIG. 3, the Y coordinate of the reference position of the chip pattern is displayed as, for example, "−50000". In addition, in the JOB file 20, the presence/absence of correction of a CD dimension displayed as "CD_CORRECTION" is defined.

In S104, as the ID pattern writing data generating step, the ID pattern writing data generating unit 12 receives ID character information in the JOB file 20 which defines a shape of an ID figure showing identification information of a mask and generates a pattern writing data (ID pattern writing data) of the ID figure on the basis of the ID character information. The ID pattern writing data generating unit 12 generates the ID pattern writing data of the ID figure in the same format as that of the chip pattern writing data.

Figure 4:
FIG. 4 is a diagram showing an example of an ID figure in the first embodiment.

FIG. 4 is a diagram showing an example of an ID figure in the first embodiment. FIG. 4 shows an example in which an ID figure 30 is generated by a "QR code" (registered trademark). However, the standard of the ID figure is not limited to the "QR code" (registered trademark).

Figure 5:
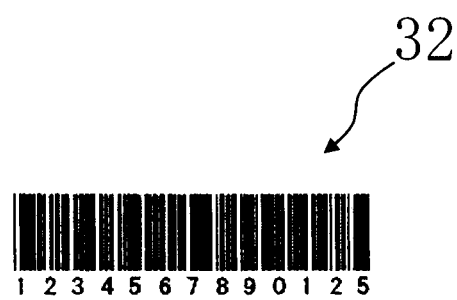
FIG. 5 is a diagram showing another example of the ID figure in the first embodiment.

FIG. 5 is a diagram showing another example of an ID figure in the first embodiment. FIG. 5 shows an example in which an ID figure 32 is generated by a "bar-code". As another standard, an existing standard such as "PDF417", "DataMatrix", "Maxi", or "Code" may be used. The ID figure may be a one-dimensional figure or a two-dimensional figure. Identification information of the mask may be stored as an ID figure written by the generated ID pattern writing data.

In S106, as the pattern writing data synthesizing step, the pattern writing data synthesizing unit 14 reads chip pattern writing data from the magnetic disk drive 140. The generated ID pattern writing data is input to synthesize both the data.

In S108, as the verifying step, the verifying unit 16 verifies whether a chip pattern represented by the chip pattern writing data overlaps an ID figure represented by the ID pattern writing data.

Figure 6A:
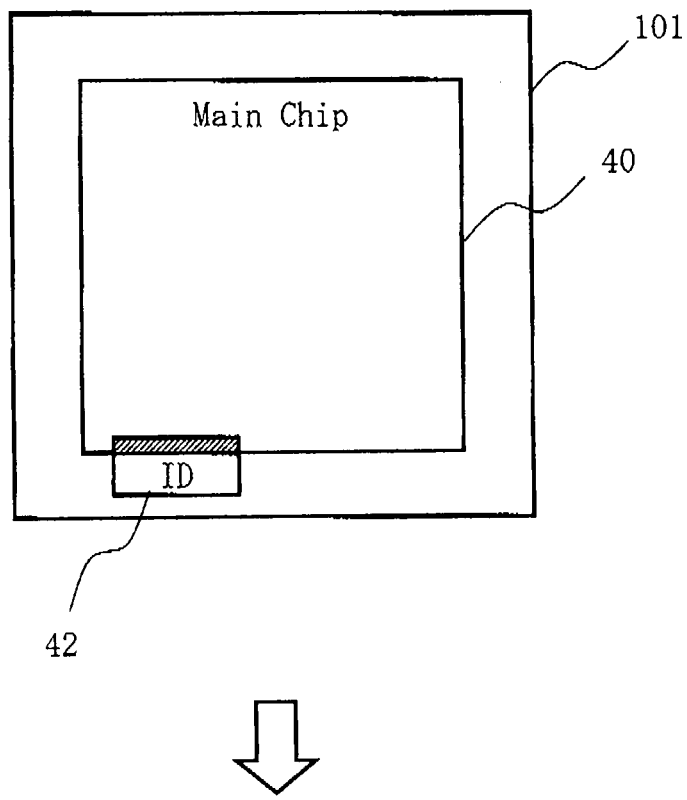
FIGS. 6A and 6B are conceptual diagrams for explaining verification contents in the first embodiments.
Figure 6B:
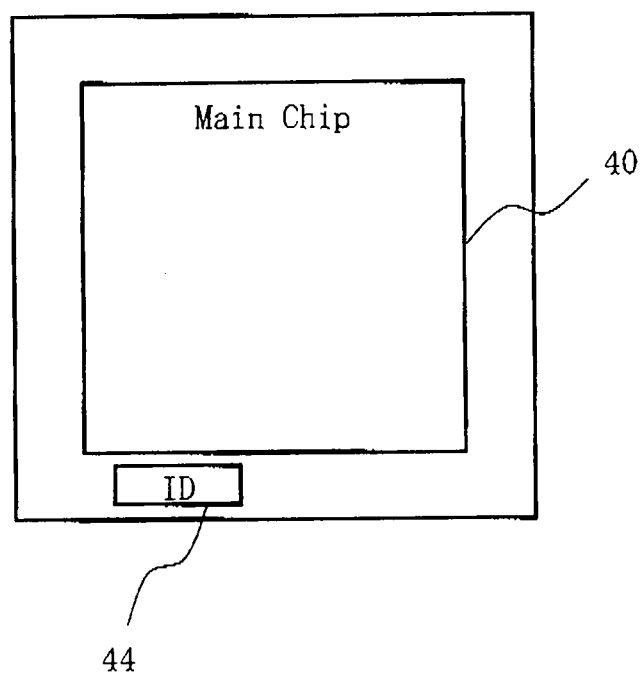
Figure 7:
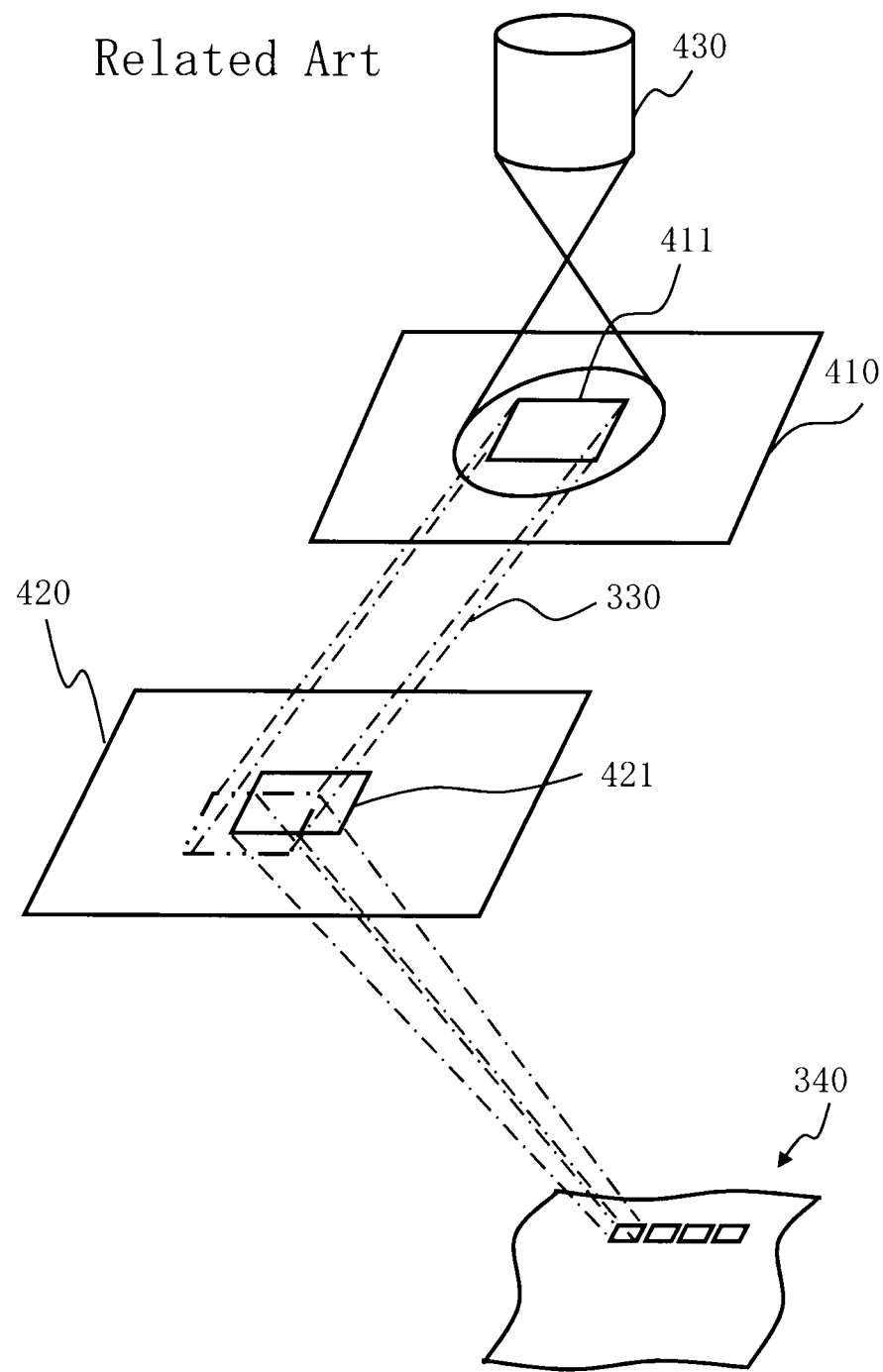
FIG. 7 is a conceptual diagram for explaining an operation of a related variable-shaped electron beam lithography apparatus.

FIGS. 6A and 6B are conceptual diagrams for explaining verification contents in the first embodiment. FIG. 6A shows a state in which an ID figure 42 overlaps a chip frame 40 of the target object 101. In this case, the verifying unit 16 determines NG as a verification result. The operation shifts to S110. On the other hand, FIG. 6B shows a state in which an ID figure 44 does not overlap the chip frame 40 of the target object 101. In this case, the verifying unit 16 determines OK as a verification result. The operation shifts to S112. This overlapping verification may be performed on the basis of the synthesized pattern writing data. As another method, the verifying unit 16 may verify whether the chip pattern overlaps the ID figure on the basis of the chip frame size, a reference position of the chip frame, a reference position of the ID figure, and a size of the ID figure, defined in the JOB file 20.

In S110, as the coordinate/size correcting step, the coordinate/size correcting unit 18 corrects the reference position of the ID figure defined in the JOB file 20 or the size of the ID figure defined in the JOB file 20 when the ID figure 42 overlaps the chip frame 40. After the data of the JOB file 20 is corrected, the operation returns to S104. The steps in S104 to S108 are repeated to perform automatic correction to prevent the ID figure 44 from overlapping the chip frame 40 as shown in FIG. 6B.

In S112, as the pattern writing data processing step, the pattern writing data processing unit 110 converts the pattern writing data into data of a format in the lithography apparatus 100 on the basis of the synthesized pattern writing data after a plurality of converting steps are performed.

In S114, as the writing step, by using the data processed on the basis of the synthesized pattern writing data, the pattern writing unit 150 writes a chip pattern and an ID figure on the target object 101. More specifically, the following operations are performed.

An electron beam 200 emitted from the electron gun assembly 201 serving as an example of an irradiating unit illuminates an entire area of the first aperture plate 203 having a square, for example, rectangular hole by the illumination lens 202. In this case, the electron beam 200 is shaped into a square, for example, rectangular shape. The electron beam 200 of a first aperture image passing through the first aperture plate 203 is projected on the second aperture plate 206 by the projection lens 204. A position of the first aperture image on the second aperture plate 206 is deflectively controlled by the deflector 205 to make it possible to change a beam shape and a beam size. The deflector 205 is controlled by the deflection control circuit 112 through the DAC 114. As a result, the electron beam 200 is shaped. The electron beam 200 of the second aperture image passing through the second aperture plate 206 is focused by the objective lens 207 and deflected by the deflector 208. The deflector 208 is controlled by the deflection control circuit 112 through the DAC 116. The deflection control circuit 112 is controlled by a control signal output according to the data processed by the pattern writing data processing unit 110. As a result, the electron beam 200 is irradiated on a desired position of the target object 101 on the X-Y stage 105 which continuously moves.

As described above, according to the first embodiment, the data is converted into ID pattern writing data to identify the target object 101 on the basis of character information in the lithography apparatus 100. After the conversion, the ID figure can be directly written. In this manner, an input operation to the lithography apparatus 100 can be performed by character information, not the graphic data. Therefore, even though pattern writing data is not created in advance, the character information may be input to the lithography apparatus 100. Therefore, it is possible to eliminate the necessity to create the graphic data by an external apparatus or the like in advance. Furthermore, since the character information may be used, an operator of the apparatus can build information obtained immediately before the pattern writing as ID character information. Furthermore, the information obtained immediately before the pattern writing can be automatically input as ID information from a function mounted on the lithography apparatus on the basis of the character information.

The "units" or "steps" described in the above explanation can be configured by programs which can be operated by a computer. Alternatively, the "units" or "steps" may be executed by not only the program serving as software but also a combination between hardware and the software, or may be executed by a combination between the hardware and firmware. When the "units" or "steps" are configured by the program, the program is recorded on a readable record carrier body such as a magnetic disk drive, a magnetic tape device, an FD, a CD, a DVD, an MO, a RAM or the like. For example, the program is stored in the memory 126. Alternatively, at least one of these recording media may be connected to the control computer 120, the pattern writing data processing unit 110, or the like. Alternatively, the record carrier body may be mounted in the control computer 120 or the pattern writing data processing unit 110.

The embodiment is described with reference to the concrete examples. However, the invention is not limited to these concrete examples.

Parts such as apparatus configurations and control methods which are not directly necessary for the explanation of the invention are not be repeated here. However, the necessary apparatus configurations and the necessary control methods can be arbitrarily selected and used. For example, a control unit configuration which controls the lithography apparatus 100 is not repeated in the description. However, a necessary control unit configuration can be arbitrarily selected and used, as a matter of course.

All lithography methods and apparatuses each of which includes the elements according to the invention and which can be arbitrarily designed by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lithography apparatus for writing a pattern on an exposure mask using a charged particle beam, comprising:
   an interpreter unit configured, by receiving a data file including character information which uses at least one of letter and numeral and specifies a shape of an identification figure representing identification information of the exposure mask before pattern writing process, to interpret contents of the character information;
   a generating unit configured, by receiving the character information, to generate pattern writing data of the identification figure on the basis of the character information in a same format as that of a pattern writing data of a pattern written on the exposure mask after the contents of the character information is interpreted;
   a synthesizing unit configured, by receiving the pattern writing data of the pattern written on the exposure mask, to synthesize the pattern writing data of the pattern and the pattern writing data of the identification figure;
   a verifying unit configured, by receiving frame information of the pattern written on the exposure mask, to verify whether the identification figure overlaps the pattern on the basis of the character information and the frame information of the pattern in a case that the identification figure and the pattern are written on the exposure mask using a charged particle beam;
   a correcting unit configured to selectively correct a reference position and a size of the identification figure when the identification figure overlaps the pattern in the case; and
   a pattern writing unit configured to write the pattern and the identification figure on the exposure mask on the basis of the synthesized pattern writing data in a case that it has been verified that the identification figure does not overlap, using a charged particle beam.

2. The apparatus according to claim 1, wherein as the character information, at least one of information of a time of day at which the pattern writing data of the pattern is input to the lithography apparatus and a time of day at which a pattern writing process is started is included, and at least one of the time of day at which the pattern writing data of the pattern is input to the lithography apparatus and the time of day at which the pattern writing process is started, is automatically input to the data file in the lithography apparatus.

3. The apparatus according to claim 1, wherein as the character information, at least one of information for identifying the exposure mask itself, a name of the pattern writing data of the pattern, identification information of the lithography apparatus, a time of day at which the pattern is written, and an operator name of the lithography apparatus is included.

4. A lithography method comprising:
   by receiving a data file including character information which uses at least one of letter and numeral and specifies a shape of an identification figure representing identification information of an exposure mask before pattern writing process, interpreting, with an apparatus for writing a pattern on an exposure mask using a charged particle beam, contents of the character information;
   by receiving the character information, generating, with the apparatus for writing the pattern on the exposure mask using the charged particle beam, pattern writing data of the identification figure on the basis of the character information in a same format as that of a pattern writing data of a pattern written on the exposure mask after the contents of the character information is interpreted;

by receiving the pattern writing data of the pattern written on the exposure mask, synthesizing, with the apparatus for writing the pattern on the exposure mask using the charged particle beam, the pattern writing data of the pattern and the pattern writing data of the identification figure;

by receiving frame information of the pattern written on the exposure mask, verifying, with the apparatus for writing the pattern on the exposure mask using the charged particle beam, whether the identification figure overlaps the pattern on the basis of the character information and the frame information of the pattern in a case that the identification figure and the pattern are written on the exposure mask using a charged particle beam;

correcting, with the apparatus for writing the pattern on the exposure mask using the charged particle beam, selectively a reference position and a size of the identification figure when the identification figure overlaps the pattern in the case; and writing, with the apparatus for writing the pattern on the exposure mask using the charged particle beam, the pattern and the identification figure on the exposure mask on the basis of the synthesized pattern writing data in a case that it has been verified that the identification figure does not overlap.

5. The method according to claim 4, wherein as the character information, at least one of information of a time of day at which the pattern writing data of the pattern is input to the lithography apparatus and a time of day at which a pattern writing process is started is included.

6. The method according to claim 4, wherein as the character information, at least one of information for identifying the exposure mask itself, a name of the pattern writing data of the pattern, identification information of the lithography apparatus, a time of day at which the pattern is written, and an operator name of the lithography apparatus is included.

7. The apparatus according to claim 1, wherein the generating unit is configured to regenerate pattern writing data of the identification figure so that the identification figure does not overlap a pattern written on the exposure mask when the identification figure overlaps the pattern, and the synthesizing unit is configured to synthesize the pattern writing data of the pattern and the pattern writing data of the identification figure which does not overlap the pattern written on the exposure mask.

8. The method according to claim 4, further comprising:

regenerating pattern writing data of the identification figure so that the identification figure does not overlap a pattern written on the exposure mask when the identification figure overlaps the pattern; and synthesizing, the pattern writing data of the pattern and the pattern writing data of the identification figure which does not overlap the pattern written on the exposure mask.

\* \* \* \* \*